(12) United States Patent
Murari et al.

(10) Patent No.: US 6,969,637 B2
(45) Date of Patent: Nov. 29, 2005

(54) ELECTRONIC SEMICONDUCTOR DEVICE HAVING A THERMAL SPREADER

(75) Inventors: Bruno Murari, Monza (IT); Ubaldo Mastromatteo, Bareggio (IT); Benedetto Vigna, Pietrapertosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/893,021

(22) Filed: Jul. 16, 2004

(65) Prior Publication Data

US 2005/0009300 A1    Jan. 13, 2005

Related U.S. Application Data

(62) Division of application No. 09/874,381, filed on Jun. 4, 2001, now Pat. No. 6,784,522.

(30) Foreign Application Priority Data

Jun. 6, 2000    (EP) .................................. 00830407

(51) Int. Cl.$^7$ ......................... H01L 21/44; H01L 21/48; H01L 21/50; H01L 21/301; H01L 21/46
(52) U.S. Cl. ..................... 438/113; 438/106; 438/122; 438/460
(58) Field of Search ..................... 438/106, 113, 122, 438/460

(56) References Cited

U.S. PATENT DOCUMENTS

| | | | |
|---|---|---|---|
| 3,973,320 A * | 8/1976 | Greco et al. | |
| 3,978,578 A * | 9/1976 | Murphy | 438/114 |
| 4,536,469 A * | 8/1985 | Adlerstein | |
| 5,070,040 A * | 12/1991 | Pankove | |
| 5,073,230 A * | 12/1991 | Maracas et al. | 438/458 |
| 5,138,439 A * | 8/1992 | Kobiki | |
| 5,250,815 A * | 10/1993 | Battersby et al. | |
| 5,275,958 A * | 1/1994 | Ishikawa | |
| 5,324,981 A * | 6/1994 | Kobiki et al. | |
| 5,338,967 A * | 8/1994 | Kosaki | |
| 5,521,425 A | 5/1996 | Deeney | 257/666 |
| 5,593,917 A * | 1/1997 | Nuyen | |
| 5,807,783 A * | 9/1998 | Gaul et al. | |
| 5,864,169 A * | 1/1999 | Shimura et al. | |
| 5,907,477 A | 5/1999 | Tuttle et al. | 361/760 |
| 5,966,593 A * | 10/1999 | Budnaitis et al. | 438/118 |
| 6,011,697 A * | 1/2000 | Budnaitis et al. | 361/792 |
| 6,093,970 A | 7/2000 | Ohsawa et al. | 257/777 |
| 6,307,261 B1 | 10/2001 | Val et al. | 257/698 |
| 6,472,246 B1 * | 10/2002 | Thomas et al. | 438/64 |
| 6,746,938 B2 * | 6/2004 | Uchiyama et al. | |
| 2003/0211708 A1 * | 11/2003 | Acklin et al. | |

FOREIGN PATENT DOCUMENTS

| | | |
|---|---|---|
| EP | 0 618 619 | 10/1994 |
| JP | 403087027 | * 4/1991 |

* cited by examiner

Primary Examiner—Craig A. Thompson
Assistant Examiner—Heather A. Doty
(74) Attorney, Agent, or Firm—Lisa K. Jorgenson; Harold H. Bennett, II; Seed IP Law Group PLLC

(57) ABSTRACT

The electronic device is formed in a die including a body of semiconductor material having a first face covered by a covering structure and a second face. An integral thermal spreader of metal is grown galvanically on the second face during the manufacture of a wafer, prior to cutting into dice. The covering structure comprises a passivation region and a protective region of opaque polyimide; the protective region and the passivation region are opened above the contact pads for the passage of leads.

19 Claims, 2 Drawing Sheets

ELECTRONIC SEMICONDUCTOR DEVICE HAVING A THERMAL SPREADER

TECHNICAL FIELD

The invention relates to an electronic semiconductor device having a thermal spreader.

BACKGROUND OF THE INVENTION

As is known, containers for devices which have to dissipate a certain quantity of heat have a thermal spreader element. The thermal spreader may be formed by a metal region fixed to a ceramic base then fixed to the device or by a portion of the lead frame.

For a thermal spreader using a ceramic base, two fixing operations are required: a first operation to bond the metal region to the ceramic base and a second operation to attach the device to the metal region; consequently the fixing costs are considerable. Furthermore, this solution involves considerable space: indeed, to ensure that the device and the metal region overlap under all conditions and to prevent undesirable short-circuits even in presence of possible misalignments, the metal region has a larger area than the device; furthermore, the electrical connection wires which connect suitable conductive areas formed on the ceramic base to the contact pads of the device need to be formed at a certain distance from the metal region. Overall, therefore, the area required on the ceramic base for fixing and connecting the device is considerably larger than the area of the device. This solution further requires the manufacture of long connection wires, which is undesirable.

Forming the thermal spreader directly on the lead frame has the following disadvantages: the chip/base assembly has two interfaces; a first interface is present between the chip and the lead frame and a second interface is present between the lead frame and the ceramic base. The connection between the chip and the printed circuit requires two wires in series and thus has greater resistance.

SUMMARY OF THE INVENTION

According to the invention, there are provided an electronic device and a relative manufacturing process.

In a preferred embodiment of the invention, the electronic device is formed as one of a plurality of electronic devices formed on a wafer. Prior to cutting the wafer into dice, an integral thermal spreader of metal is galvanically grown on a lower surface of the wafer, and a covering structure, which comprises a passivation region and a protective region of opaque polyimide is formed on an upper surface of the wafer. The protective region and the passivation region are opened above the contact pads for the passage of leads.

BRIEF DESCRIPTION OF THE DRAWINGS

For an understanding of the invention a preferred embodiment will now be described, purely by way of non-exhaustive example with reference to the accompanying drawings.

DETAILED DESCRIPTION OF THE INVENTION

Figure 1:
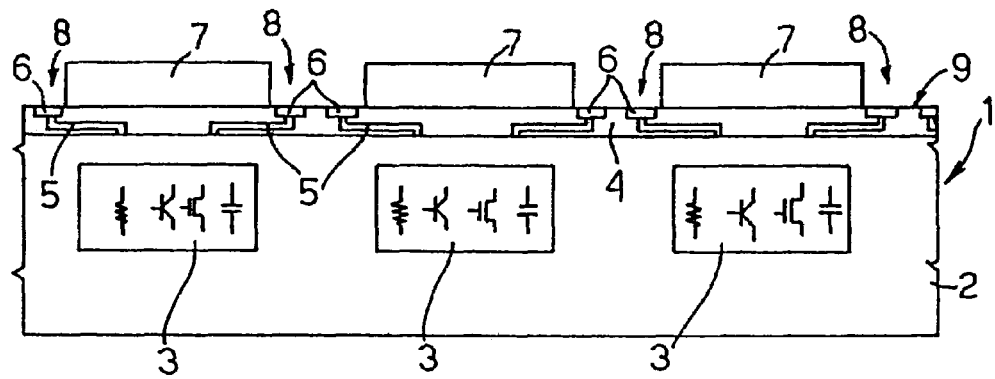
FIG. 1 shows a cross-section of a semiconductor material wafer in a first step of the manufacturing process.

FIG. 1, in which the various regions are not to scale, shows a wafer 1 comprising a body 2 of semiconductor material. In a known manner, the semiconductor body 2 has various conductive and/or insulating regions forming a plurality of identical electronic devices 3, shown in diagrammatic form by the electrical symbols of some components. An insulating layer 4, for example of BPSG (Boron Phosphorus Silicon Glass), extends on top of the body 2; metal connection lines 5 extend within the insulating layer 4 and have one end connected to the conductive regions formed inside the body 2, in known manner and not shown in detail, and one end connected to contact pads 6 facing the upper surface of the insulating layer 4. Connection lines (not shown) may reciprocally connect two or more conductive regions inside the body 2. The contact pads are formed in portions which, after the wafer 1 has been cut into individual dice, are located next to the periphery of each die, as discussed below. A passivation layer 7, of transparent polyimide, for example with a thickness of approximately 2 $\mu$m, extends on a face 9 on top of the insulating layer 4 and has been opened to form openings 8 at the contact pads 6.

Figure 2:
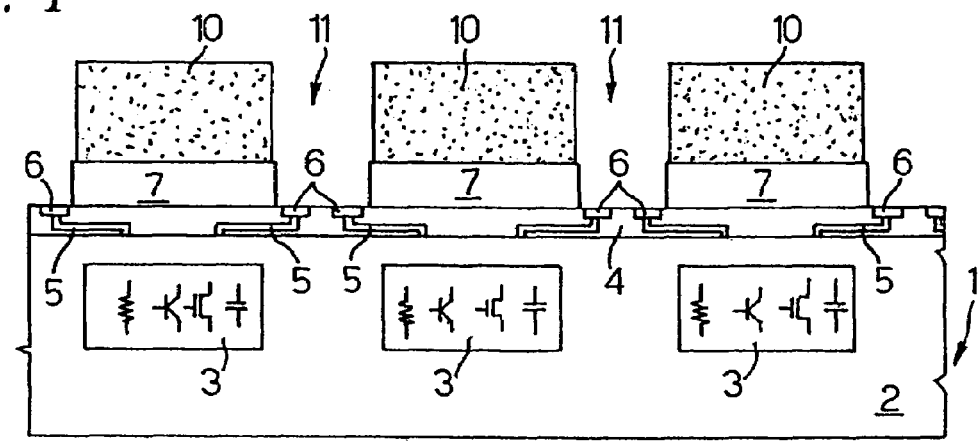
FIGS. 2 and 3 show cross-sections of the wafer of FIG. 1 in subsequent manufacturing steps.

According to FIG. 2, a protective layer 10, preferably of polyimide, for example with a thickness of 20–70 $\mu$m, preferably 30–50 $\mu$m, is then deposited on the structure of FIG. 1. The polyimide of the protective layer 10 has been rendered opaque by the presence of filler, carbon and/or graphite for example, as shown schematically in the drawings by dots, or performing a surface treatment to make it rough or again by applying an opaque upper layer (a metal layer for example). Protective layer 10 may also be formed from another thick polymer material such as the material known by the name "SU8" (Shell Upon 8), produced by SOTEC MICROSYSTEMS. Other acceptable materials may also be used for the protective layer 10.

Figure 3:
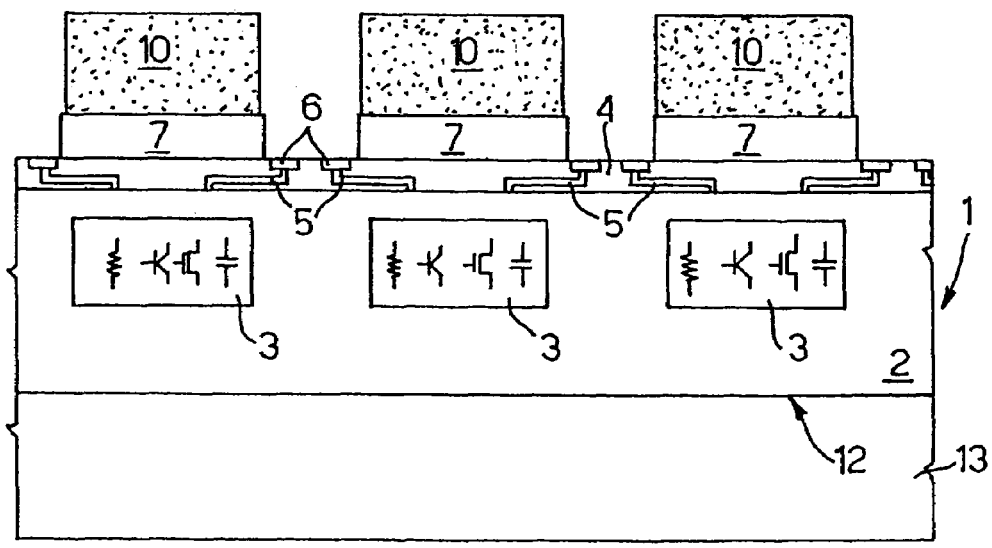

The protective layer 10 (optionally together with the opaque upper layer) is then opened by using conventional photolithographic techniques to form openings 11 extending above and in prosecution of the openings 8; only the openings 11 are labeled in FIG. 2.

as shown in FIG. 3, a metal layer 13 is then grown on a lower surface 12 of the wafer 1. Preferably the metal layer 13 is grown galvanically (electroplating technique), only the lower portion being placed in the electroplating bath and the upper surface of the wafer 1 being protected. Generally speaking, the thickness and the material of the metal layer 13 are selected in such a way as to obtain a given heat resistance with respect to the outside and thus a given heat dissipation capacity. The metal layer 13 is of copper and is thick, for example, approx. 50–200 $\mu$m, preferably 50–100 $\mu$m.

Figure 4:
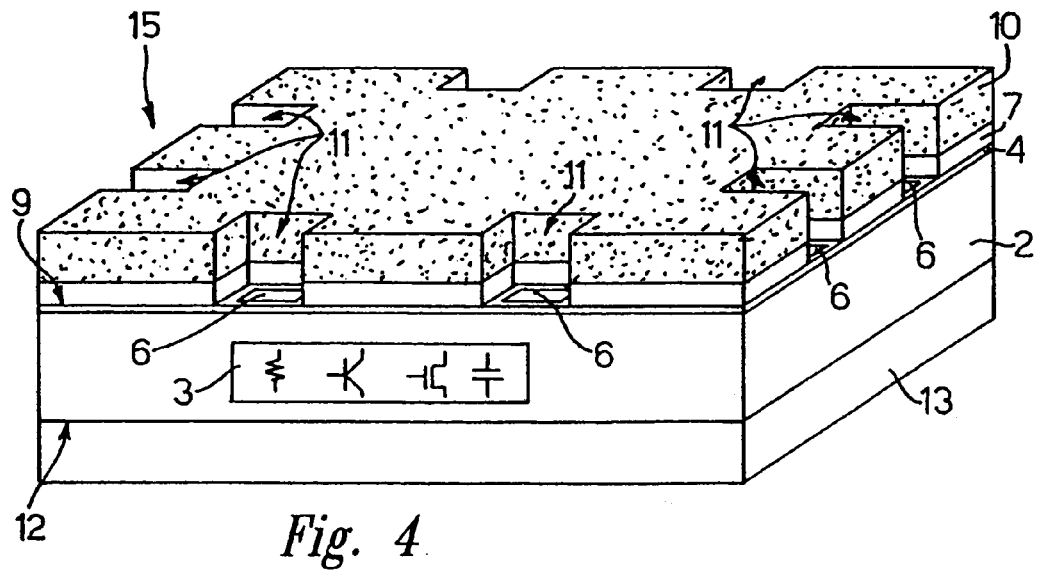
FIG. 4 shows a die obtained by cutting the wafer of FIG. 3.
Figure 5:
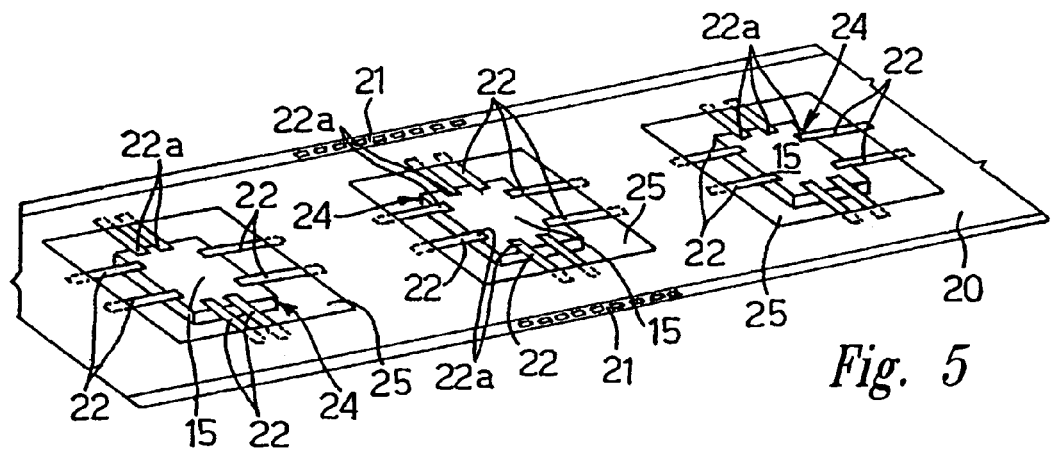
FIG. 5 shows a strip carrying a plurality of chips fixed to respective leads.

The wafer 1 is then cut into dice 15, using known methods. As shown in FIG. 4, wherein, for clarity, the regions resulting from the cutting of the various layers are denoted by the same reference numerals of the respective layers, each die 15 has a metal region 13 (adhering directly to the body 2 and defining a thermal spreader) and a protective region 10 which, in practice, replaces the conventional plastic (epoxy resin) of the package. The die 15 does not therefore need to undergo the conventional packaging operations. Furthermore, after cutting, the openings 11 are arranged on the periphery of the die 15 to allow lateral access to the contact pads 6. Leads 22 are then fixed to the die 15. Advantageously it is possible to use the known strip technique according to which the leads are carried by a flexible strip 20, of Kapton for example, having perforated entrainment edges 21. To this end, as shown in FIG. 5, the flexible strip 20 has a plurality of openings 25; the leads 22 to be connected to a die project inside each of the openings. The leads 22, preferably of gold-plated copper, are held at one end of the flexible strip 20 and are positioned exactly as required by the dice 15. Preferably the leads 22 have projections or bumps 26, FIG. 6, on their free end 22a on the face to be welded to the dice 15. For welding, the flexible strip 20 and a die 15, held and moved by a suitable machine, are brought towards each other so as to bring the free end 22a of the leads 22 inside the openings 11, with the bumps 26 in contact with contact pads 6; the leads are then welded by thermocompression or ultrasound.

After welding, as shown in FIG. 5, in each opening 25 the flexible strip 20 carries a die 15 fixed to the respective leads 22, forming a chip 24. In this way the dice 15 may be stored and transported.

Figure 6:
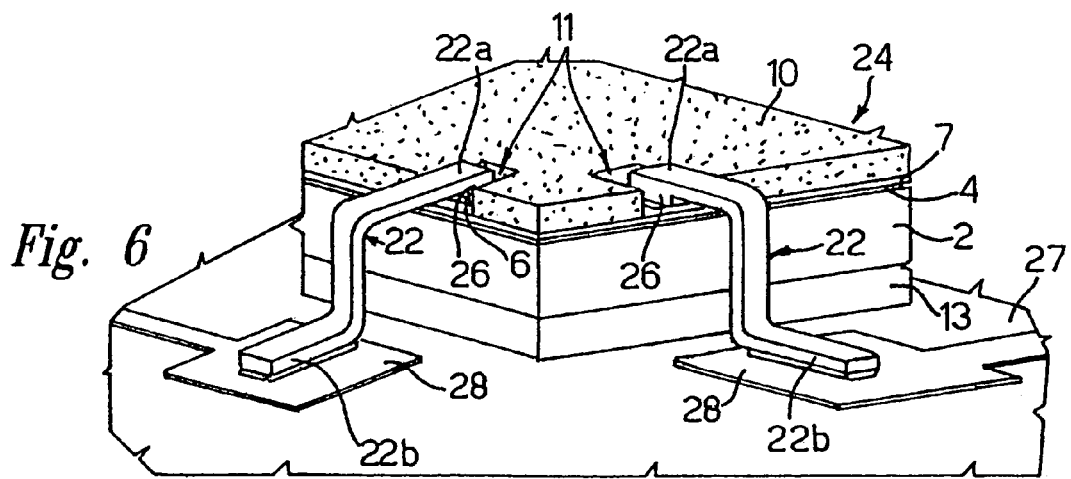
FIG. 6 shows a portion of a chip fixed to a base.

When a chip 24 is to be fixed to a ceramic base 27, FIG. 6, the flexible strip 20 is cut, so as to release the leads 22 from the flexible s rip 20, the leads 22 are bent and their end, just released and denoted by 22b in FIG. 6, is welded to respective contact pads 28 present on the ceramic base 27, for example using added material, conveniently, gold, but other metals may be used.

In this way the metal region 13 forms a thermal spreader integral with the die 15. The absence of intermediate materials between the body 2 and the metal region 13 and the contact between them over the entire area of the body 2 provide high heat conduction. This solution is therefore particularly suited to devices with average power dissipation and those operating in temperatures below 180–200° C. It can be used for devices with a standard package or for hybrid circuits. It is used particularly for telephone applications, for hard disk drivers and automotive applications.

Forming the metal region 13 integrally with the die in a manufacturing phase of the wafer 1 is particularly advantageous in that it requires a single growth phase for all the dice of a wafer, eliminates a bonding phase for each base and reduces the space required for welding the leads 22. Furthermore, the leads 22 are shorter than was previously required; consequently they have improved electrical properties and less risk of breakage.

The simultaneous presence of a thick protection, formed by the protective layer 10, on the front of the chip and the thermal spreader, formed by the metal region 13 of a thick copper layer, in the back of the chip is very advantageous, since the protective layer 10 and the metal region 13 have compensating characteristics as regards thermo-mechanical stress, caused by the manufacture steps.

Replacing the plastic of the package with the protective region 10 enables manufacturing costs to be reduced, since the protective region is formed during wafer manufacturing, and does not require a suitable molding for each die 15. The protective region 10 is highly robust and from the mechanical point of view it adequately protects the die 15 which can therefore be handled without damaging the components of the integrated electronic device; in particular, the protective layer 10 protects the wafer 1 during the steps required to form the metal layer 13.

An additional protective layer may optionally be formed over the assembly to enclose a part of leads 22 and a part of the device, to further protect the device and lead connections. Alternatively, the entire assembly may be enclosed, leaving only the bottom face of the metal layer exposed to dissipate heat.

The term "thermal spreader", as used in this document refers to a structure that dissipates heat from a semiconductor device, in the manner of a heat conductor or heat sink. A thermal spreader is a structure that spreads heat energy. Such a structure is designed with parameters appropriate to dissipate the heat energy produced in a particular semiconductor device in a particular environment, and thus maintain the device at an optimum operating temperature. Parameters that affect the heat dissipation properties of a thermal spreader include composition, mass, surface area in contact with the device, presence of contaminants or intermediate materials between thermal spreader and device, and surface area in contact with other, secondary heat dissipation mediums. Possible secondary heat dissipation mediums are air or other gas, fluid coolants, or the ceramic base described in this document.

Finally it will be clear that numerous modifications and variations may be introduced to the electrical device and the manufacturing process described herein, all of which come within the scope of the invention, as defined in the accompanying claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing an electronic device comprising the steps of:
    forming a wafer, including a body of semiconductor material having first and second faces;
    forming a covering structure on said first face of said body, including forming a passivation layer on said first face of said body and forming a mechanical protection layer on said passivation layer;
    forming a spreader layer in direct contact with said second face of said body; and
    cutting said wafer, including said covering structure, into a plurality of dice.

2. The process of claim 1 wherein said step of forming a spreader layer comprises the step of galvanically growing said spreader layer.

3. The process of claim 2 wherein said spreader layer is of metal.

4. The process of claim 1 wherein said mechanical protection layer is of polyimide.

5. The process of claim 4 wherein said mechanical protection layer is opaque and contains fillers.

6. The process of claim 5 wherein said fillers are selected from the group containing carbon and graphite.

7. A process for manufacturing an electronic device comprising the steps of:
    forming a wafer, including a body of semiconductor material having first and second faces;
    forming a passivation layer on said first face of said body;
    forming first openings in said passivation layer to expose electrical connection regions formed in a insulation layer extending between said body and said passivation layer;
    forming a mechanical protection layer on said passivation layer;
    forming second openings in said protection layer, aligned with and in continuation of said first openings;

forming a spreader layer in direct contact with said second face of said body; and cutting said wafer into a plurality of dice.

8. The process of claim 7, after said step of cutting, welding connection leads to said electrical connection regions using a strip technique.

9. A method comprising:

forming, on a wafer, a plurality of semiconductor devices;

forming, by galvanic growth, a heat dissipation layer on a lower face of the wafer;

forming a covering layer including a passivation layer and a mechanical protection layer on an upper surface of the wafer; and cutting the wafer into a plurality of dice, such that each die includes one of the plurality of semiconductor devices, a portion of the heat dissipation layer, and a portion of the covering layer.

10. The method of claim 9 wherein the upper surface of the wafer comprises a plurality of electrical contact pads associated with the plurality of semiconductor devices, and the covering layer comprises openings for providing access to the plurality of electrical contact pads.

11. The method of claim 10, further comprising the step of affixing a first end of one of a plurality of leads to each one of the plurality of electrical contact pads.

12. The method of claim 11, further comprising:

affixing each of the plurality of dice to one of a plurality of ceramic bases via the portion of the heat dissipation layer, where the plurality of ceramic bases includes a plurality of electrical traces; and affixing a second end of each one of the plurality of leads to one of the plurality of electrical traces.

13. The process of claim 3 wherein said spreader layer is of copper.

14. The process according to claim 1 comprising:

forming, prior to said step of forming a mechanical protection layer, first openings in said passivation layer to expose electrical connection regions formed in a insulation layer extending between said body and said passivation layer; and forming, after said step of forming a mechanical protection layer, second openings in said mechanical protection layer, aligned with and in continuation of said first openings.

15. The process of claim 7, further comprising affixing each of the plurality of dice to a respective ceramic base.

16. The process of claim 7, further comprising affixing an electrical lead to each of the electrical connection regions via the first and second openings.

17. A method, comprising:

forming, on a wafer, a semiconductor device having a plurality of electrical contact pads;

forming a heat dissipation layer on a lower face of the wafer;

forming a covering layer, including a passivation layer and a mechanical protection layer, on an upper surface of the wafer; and forming, over each of the plurality of electrical contact pads, a respective opening in the covering layer.

18. The method of claim 17 wherein the forming a semiconductor device step includes forming a plurality of semiconductor devices.

19. The method of claim 18, further comprising dividing the wafer into a plurality of dice, each die having one of the plurality of semiconductor devices, a portion of the heat dissipation layer, and a portion of the covering layer.

\* \* \* \* \*